United States Patent
Iwazaki

(10) Patent No.: US 6,563,848 B1
(45) Date of Patent: May 13, 2003

(54) SEMICONDUCTOR LASER DRIVE DEVICE

(75) Inventor: Shoji Iwazaki, Tokyo (JP)

(73) Assignee: Pentax Corporation, Tokyo (JP)

( * ) Notice: Subject to any disclaimer, the term of this patent is extended or adjusted under 35 U.S.C. 154(b) by 63 days.

(21) Appl. No.: 09/632,623

(22) Filed: Aug. 4, 2000

(30) Foreign Application Priority Data

Aug. 6, 1999 (JP) .......................................... 11-223803

(51) Int. Cl.[7] ................................................ H01S 3/00
(52) U.S. Cl. ........................ 372/38.02; 372/31; 372/38; 247/237; 347/246; 358/296
(58) Field of Search ........................... 372/38.01, 38.02, 372/29.011, 29.012, 29.014, 29.015

(56) References Cited

U.S. PATENT DOCUMENTS

| | | | |
|---|---|---|---|
| 2,606,197 A | * 8/1952 | Wagner et al. | |
| 4,761,659 A | 8/1988 | Negishi | |
| 4,802,179 A | 1/1989 | Negishi | |
| 4,849,980 A | 7/1989 | Shoji et al. | |
| 4,868,675 A | * 9/1989 | Joosten et al. | 358/296 |
| 4,912,714 A | * 3/1990 | Hatanaka et al. | 372/31 |
| 5,225,884 A | * 7/1993 | Stark et al. | 356/73 |
| 5,305,337 A | 4/1994 | Araki et al. | |
| 5,923,427 A | * 7/1999 | Dong | 356/375 |
| 5,986,687 A | * 11/1999 | Hori | 347/246 |
| 6,111,901 A | * 8/2000 | Taguchi et al. | 372/38 |
| 6,259,466 B1 | * 7/2001 | Oomura et al. | 247/237 |

FOREIGN PATENT DOCUMENTS

| | | |
|---|---|---|
| JP | 7-38477 | 4/1995 |
| JP | 7-71176 | 7/1995 |
| JP | 2606197 | 2/1997 |

* cited by examiner

*Primary Examiner*—Paul Ip
*Assistant Examiner*—Tuan Nguyen
(74) *Attorney, Agent, or Firm*—Greenblum & Bernstein, P.L.C.

(57) ABSTRACT

A semiconductor laser device comprises a semiconductor laser, a photo-diode, a first input terminal and a second input terminal. A sample hold circuit, having a first switch and a capacitor, is provided between the first input terminal and the semiconductor laser. A second switch is provided between the second input terminal and the semiconductor laser. A drive current is supplied to the semiconductor laser based on a light radiation level command signal input to the first input terminal. A constant current is generated based on a signal input through the second input terminal. In a sampling mode, the first and second switches are turned ON, and thus, a control current, which is obtained by subtracting the constant current from the drive current, is sampled by the sample hold circuit. In a holding mode, one of a bias current, obtained based on the control current and the constant current, or the drive current are supplied to the semiconductor laser, in accordance with ON/OFF of the second switch.

10 Claims, 6 Drawing Sheets

SEMICONDUCTOR LASER DRIVE DEVICE

BACKGROUND OF THE INVENTION

1. Field of the Invention

The present invention relates to a semiconductor laser drive device used as a laser optical device such as a printer, a copy machine, an optical disk device and so on, and more particularly to an improvement of a distortion of an optical output waveform in a pulse modulation.

2. Description of the Related Art

Conventionally, a laser pulse light beam is used for scanning a photosensitive material provided in a laser printer, and optically recording and reproducing information on a disc in an optical disk device. Recently, a semiconductor laser, which has advantages such as miniaturization, low cost and low consumption of electric power, is used for generating a laser light beam. The semiconductor laser is supplied with a drive current, in which an intensity is varied like a pulse, to output a pulse modulated laser light beam.

In the semiconductor laser, however, the higher the temperature, the lower the optical output of the semiconductor laser. To compensate such a temperature characteristic of the semiconductor laser, an automatic power control (APC) circuit is provided in which the optical output is monitored by a photoreceptor element to control a drive current in such a manner that the optical output becomes constant regardless of the temperature.

On the other hand, it is known that, when a pulse-shape drive current is supplied to the semiconductor laser, a phenomenon such as relaxation oscillations occurs, in which, when the pulse-shape drive current is turned ON and OFF, a time-lag occurs in the optical output or a damping oscillation is superimposed on the optical output waveform. Particularly, a rise time from an idle state, in which a laser beam is radiated to some extent, to an operation state, in which the laser beam is radiated at a predetermined optical output level, is different from a rise time from a suspension state, in which the laser beam is turned OFF, to the operation state, and thus, the pulse waveform of the optical output does not exactly correspond to the pulse waveform of the drive current. Further, especially in the case of a high speed pulse modulation, since the relaxation oscillations affect the whole range of the pulse width, the waveform of the optical output cannot be rectangular, and becomes inaccurate as a signal.

Therefore, in a semiconductor laser drive device, a bias current is always supplied to the semiconductor laser, so that the time-lag and the relaxation oscillation are reduced. The optical output of the semiconductor laser hardly changes in a spontaneous emission condition, in which the drive current is lower than a threshold value, and drastically changes in proportion to the drive current in a laser oscillation condition in which the drive current is over the threshold value. Taking into consideration the optical output characteristics described above, the bias current is set to a constant value close to the threshold value, and only when a laser beam is to be output, a current for the laser oscillation is added to the bias current to obtain the drive current, which is supplied to the semiconductor laser.

However, the threshold value is changed depending upon a change of the ambient temperature, and becomes accumulatively high as the temperature becomes high. Therefore, to prevent a laser beam radiation when the laser beam should be extinguished, the bias current should be set to a value lower than a minimum value of a range within which the threshold value can be changed. Because of this, when the temperature becomes high, an effect of the bias current is lowered.

SUMMARY OF THE INVENTION

Therefore, an object of the invention is to provide a semiconductor laser drive device in which a high-speed pulse drive of the semiconductor laser can be performed without distorting the optical output waveform.

According to the present invention, there is provided a semiconductor laser drive device comprising a stabilizing processor, a sample hold processor, a generation processor, a switching processor and a control processor.

The stabilizing processor controls a drive current, used for adjusting an output power of a semiconductor laser to a predetermined level, so that the output power is stabilized. The sample hold processor is operated in a sampling mode, in which a control current is sampled, and in a holding mode, in which the control current is held. The generation processor generates a constant current. The switching processor selectively switches ON a supply of the constant current to the semiconductor laser and switches OFF the supply. The control processor controls the switching processor in synchronization with an activation of the sampling mode, so that one of the drive current and a bias current, which is obtained based on the control current and the constant current, is supplied to the semiconductor laser.

BRIEF DESCRIPTION OF THE DRAWINGS

The present invention will be better understood from the description of the preferred embodiments of the invention set forth below, together with the accompanying drawings, in which.

DESCRIPTION OF THE PREFERRED EMBODIMENTS

Figure 1:
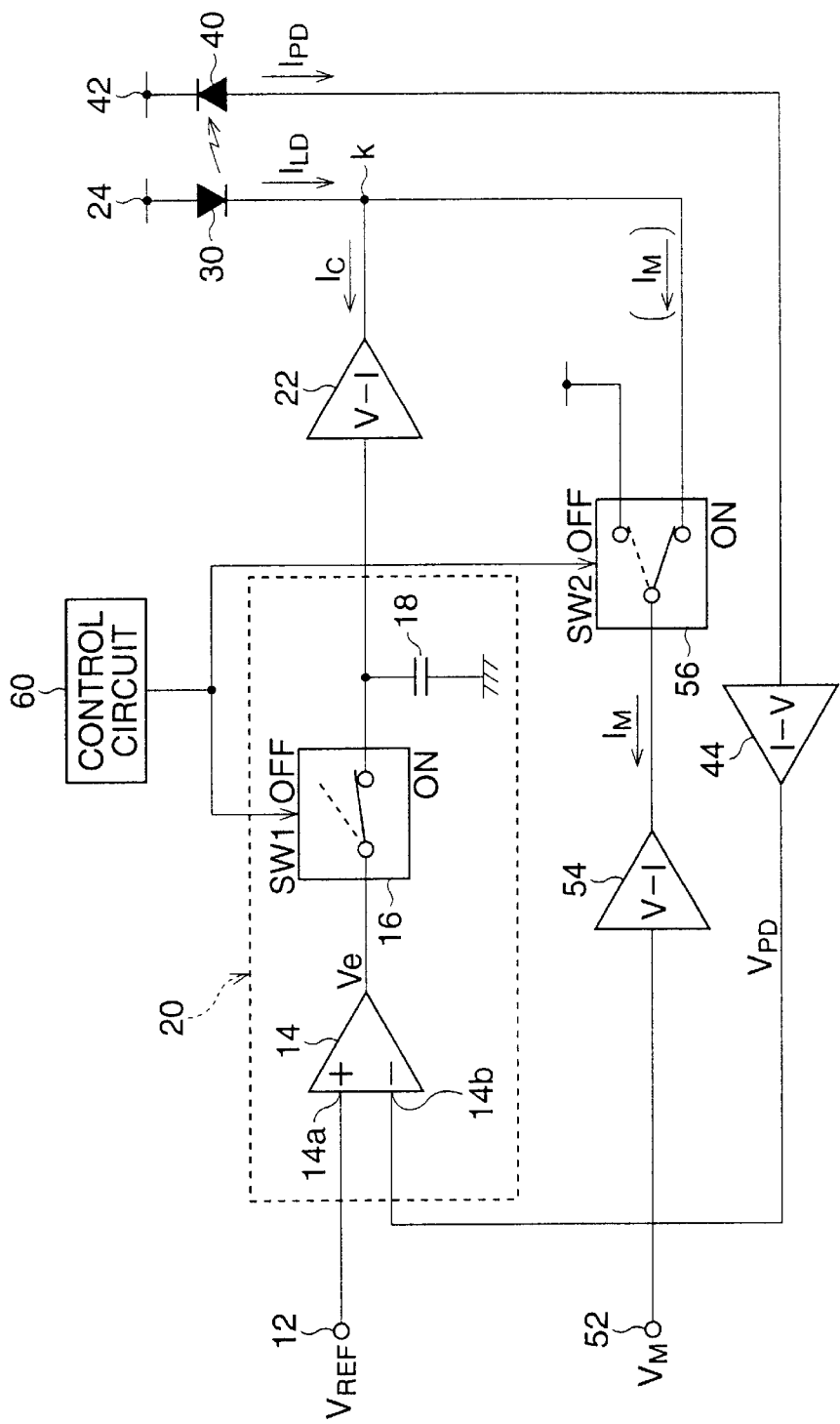
FIG. 1 is a block diagram showing a first embodiment of the semiconductor laser drive device of the present invention.

The present invention will be described below with reference to embodiments shown in the drawings.

FIG. 1 is a block diagram showing a first embodiment of the semiconductor laser drive device of the present invention. The semiconductor laser drive device is provided with a first input terminal 12 and a second input terminal 52. A voltage signal, indicating a predetermined optical output level of a semiconductor laser 30, is supplied to the first input terminal 12 as a light radiation level command signal $V_{REF}$. A cathode of the semiconductor laser 30 is controlled in such a manner that a drive current $I_{LD}$ flowing in the semiconductor laser 30 becomes a value corresponding to the light radiation level command signal $V_{REF}$, as described later.

Between the first input terminal 12 and the semiconductor laser 30, a sample hold circuit 20 and a first voltage-current conversion amplifier 22 are connected in series. The sample hold circuit 20 is provided with a comparator 14, a first switch 16 and a capacitor 18. The semiconductor laser 30 is connected to a power supply terminal 24.

A photo-diode 40 is connected to a power supply terminal 42, and receives a part of a laser beam radiated by the semiconductor laser 30 to obtain the amount the part of a current value change. An output current $I_{PD}$ of the photo-diode 40 is converted to a feedback signal $V_{PD}$, which is a voltage signal, by a current-voltage conversion amplifier 44. The feedback signal $V_{PD}$ is input to an inverting input 14b of the comparator 14.

The light radiation level command signal $V_{REF}$ is input to a non inverting input 14a of the comparator 14, so that the feedback signal $V_{PD}$ is compared with the light radiation level command signal $V_{REF}$. A comparison signal Ve output from the comparator 14 is output from the sample hold circuit 20, and is supplied to the first voltage-current conversion amplifier 22. The comparison signal Ve is converted to a current signal, and is output as an output current Ic. Note that the first voltage-current conversion amplifier 22 is a current sink type by which a drive current $I_{LD}$ is controlled in the cathode of the semiconductor laser 30.

The sample hold circuit 20 samples or holds the drive current $I_{LD}$ in accordance with a command signal of a control circuit 60.

A bias level command signal $V_M$, which has a constant value, is supplied to the second input terminal 52. Between the second input terminal 52 and a connecting point k, which is between the first voltage-current amplifier 22 and the semiconductor laser 30, a second voltage-current conversion amplifier 54 and a second switch 56 are connected in series. Namely, the first and second voltage-current amplifiers 22 and 54 are provided in parallel to each other.

The bias level command signal $V_M$, which is a voltage signal input through the second input terminal 52, is converted to a constant current $I_M$ by the second voltage-current amplifier 54, and is output therefrom. The second switch 56 is turned ON and OFF in accordance with a command signal output from the control circuit 60, so that a supply of the constant current $I_M$ to the semiconductor laser 30 is performed or stopped. Note that the second voltage-current conversion amplifier 54 is a current sink type by which the drive current $I_{LD}$ is controlled in the cathode of the semiconductor laser 30.

An operation of the semiconductor laser drive device is described below.

When the first switch 16 is turned ON as shown by a solid line in FIG. 1, the sample hold circuit 20 is set to a sampling mode. In synchronization with the turning-ON of the first switch 16, the second switch 56 is turned ON as shown by a solid line in FIG. 1. During the sampling mode, the second switch 56 is kept in the turned-ON condition.

Therefore, in the sampling mode, the constant current $I_M$ flows in the second voltage-current conversion amplifier 54. It is supposed that the value of the drive current $I_{LD}$, which is necessary for the semiconductor laser 30 to show a predetermined optical output level Po, is Ip. Under this condition, a current Ic, which is obtained by subtracting the constant current $I_M$ from the necessary drive current Ip, flows between the connecting point k and the first voltage-current conversion amplifier 22, and thus, the current Ic is sampled by the sample hold circuit 20 so that an electric charge corresponding to the current IC is held in the capacitor 18.

Further, in the sampling mode, a feedback loop (i.e., an APC circuit) is formed by the photo-diode 40, the current-voltage amplifier 44, the comparator 14 and the first voltage-current conversion amplifier 22. The APC circuit controls the current Ic in such a manner that an output (i.e., the feedback signal $V_{PD}$) becomes equal to the light radiation level command signal $V_{REF}$. As a result, the drive current Ip, which is proper and corresponds to the light radiation level command signal $V_{REF}$, always flows in the semiconductor laser 30, regardless of a change of the temperature, so that the semiconductor laser 30 irradiates at a predetermined optical output level Po.

Thus, the necessary drive current Ip of the sampling mode coincides with the sum of the constant current $I_M$ and the current Ic, which is controlled by the APC circuit, and the current Ic is controlled in such a manner that the necessary drive current Ip becomes equal to a proper value regardless of the temperature change.

On the other hand, when the first switch 16 is turned OFF as shown by a broken line in FIG. 1, the sample hold circuit 20 is set to a holding mode. In the holding mode, an electric charge corresponding to the current Ic, which flowed immediately before the switching to the holding mode, is held in the capacitor 18, and the current Ic is kept flowing in the semiconductor laser 30. Namely, the current Ic is supplied to the semiconductor laser 30 as the bias current.

At this time, when the second switch 56 is turned ON and OFF in accordance with a pulse signal output from the control circuit 56 and changed between high (H) and low (L), either the necessary drive current Ip, which is obtained by adding the constant current $I_M$ to the bias current Ic, or the bias current Ic flows in the semiconductor laser 30, in accordance with the H/L of the pulse signal.

Figure 2:
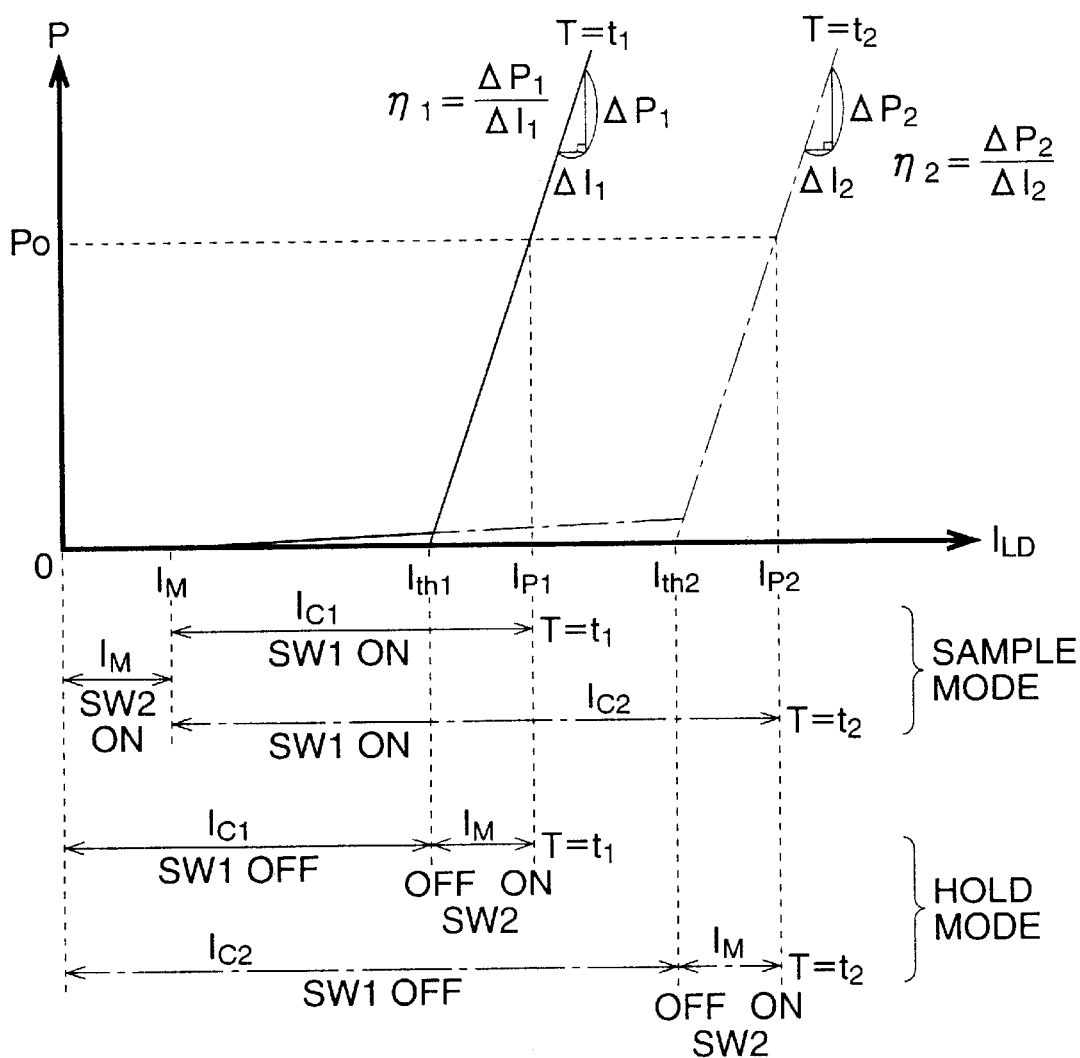
FIG. 2 is a graph indicating a drive current/optical output characteristics of the semiconductor laser of the first embodiment.

FIG. 2 shows a graph indicating drive current/optical output characteristics of the semiconductor laser 30. A solid line shows optical output characteristics when the temperature $T=t_1$, and a one-dot chained line shows optical output characteristics when the temperature $T=t_2$ ($t_2>t_1$).

When the temperature $T=t_1$, the optical output P is hardly changed in a spontaneous emission condition in which the drive current $I_{LD}$ is lower than a threshold value $I_{th1}$, and the optical output P is increased in proportion to the drive current $I_{LD}$ in a laser emission condition in which the drive current $I_{LD}$ is higher than the threshold value $I_{th1}$. When the temperature T is increased from $t_1$ to $t_2$, the threshold value is changed from $I_{th1}$ to $I_{th2}$ ($I_{th2}>I_{th1}$) and the laser emission area is moved rightward in FIG. 2. Accordingly, a drive current, which is necessary to obtain a predetermined optical output Po, is $Ip_1$ at the temperature $t_1$, and is $Ip_2$, which is greater than $Ip_1$, at the temperature $t_2$.

In the laser emission condition, a ratio of the optical output P to the drive current $I_{LD}$ is a slope efficiency η, and is hardly changed in accordance with the temperature. Namely, $$\eta \approx \eta_1 \approx \eta_2 \tag{1}$$

wherein $\eta_1 = \Delta P_1/\Delta I_1$, $\eta_2 = \Delta P_2/\Delta I_2$.

Therefore, a current difference between the threshold value $I_{th}$ and the necessary drive current Ip is hardly changed depending upon the temperature. Namely, $$Ip_1 - I_{th1} \approx Ip_2 - I_{th2} \approx Po/\eta \tag{2}$$

In the first embodiment, the characteristic of the semiconductor 30, which is shown by equation (2), is utilized, and thus, a value, which is obtained by subtracting the threshold value $I_{th}$ from the necessary drive current Ip, is set to the constant current $I_M$. Thus, the bias current Ic approximately coincides with the threshold value $I_{th}$. Therefore, the bias current Ic, which is approximately equal to the threshold value $I_{th}$, can always be supplied to the semiconductor 30, so that a distortion of the optical output waveform can be prevented.

Figure 3:
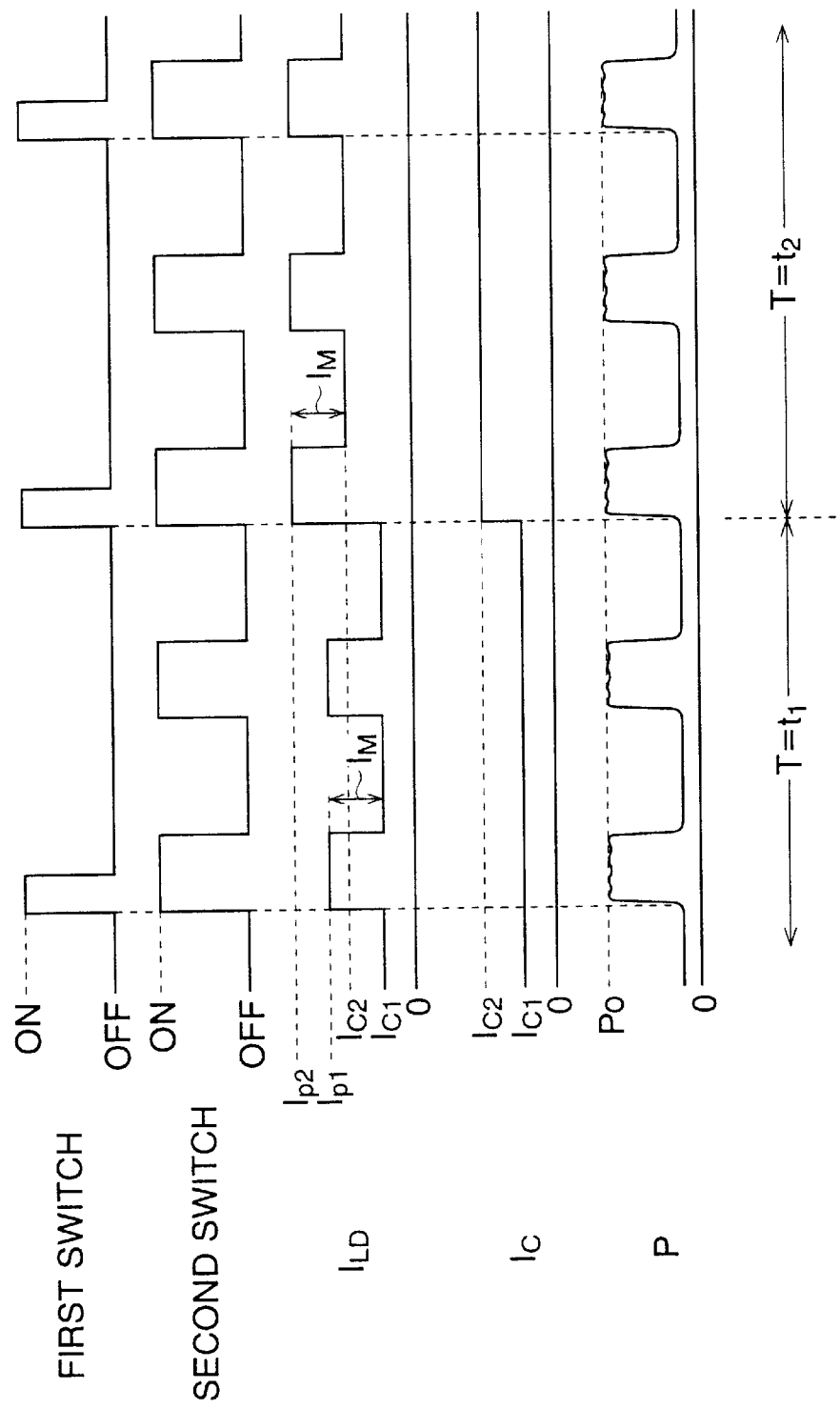
FIG. 3 is a view showing signal waveforms of a first switch of a sample hold circuit, and a second switch, a drive current, and a semiconductor laser of the first embodiment.

FIG. 3 shows signal waveforms of the first switch 16 provided in the sample hold circuit 20, the second switch 56, the necessary drive current Ip provided in the semiconductor laser 30, the bias current Ic and the optical output P of the semiconductor laser 30. In the drawing, the condition is changed from the temperature $T=t_1$ to $T=t_2$.

Note that, in a laser printer provided with the semiconductor laser drive device, a printing operation is performed in accordance with the optical output P, which is controlled in accordance with the turning ON and OFF of the second switch 56. During the ON-OFF operation of the second switch 56, when the first switch 16 is turned ON at a predetermined timing, the sampling mode is set to obtain the bias current Ic.

With reference to FIGS. 2 and 3, when the first and second switches 16 and 56 are turned ON, the sample hold circuit 20 is set to the sampling mode, so that a current difference, between the constant current $I_M$ and the necessary drive current Ip, which is $Ip_1$ in case of the temperature $t_1$, is sampled, and a bias current $Ic_1$ corresponding to the temperature $t_1$ is obtained.

When the first switch 16 is turned OFF whereby the sample hold circuit 20 is set to the holding mode, a current flowing in the semiconductor laser 30 is changed between the bias current $Ic_1$, which is obtained immediately before the holding mode is set, and the necessary drive current $Ip_1$, in synchronization with the ON/OFF operation of the second switch 56, so that the semiconductor laser 30 is lit and extinguished in synchronization with the change of the current thereof.

When the temperature T is changed to $t_2$, a current difference between the necessary drive current $Ip_2$ and the constant current $I_M$, i.e., the bias current $Ic_2$ corresponding to the temperature $t_2$, is sampled in the sampling mode. In the holding mode, a current flowing in the semiconductor laser 30 is changed between the bias current $Ic_2$ and the necessary drive current $Ip_2$, in synchronization with the ON/OFF operation of the second switch 56, so that the semiconductor laser 30 is lit and extinguished in synchronization with the change of the current thereof.

Thus, the bias current Ic is always changed in accordance with the temperature, and is set close to the threshold value $I_{th}$. Accordingly, even at a high temperature ($t_2$), a time, which is needed for reaching a predetermined optical output Po, is approximately the same as that at a low temperature ($t_1$), and thus, a time-lag of the optical output is drastically shortened in comparison with a conventional device, so that the relaxation oscillation is reduced. Therefore, even in a high speed pulse drive, an optical output waveform, which exactly corresponds to a pulse shape of the image signal, is obtained.

Further, in the first embodiment, a simple circuit, which is composed of the second voltage-current conversion amplifier 54 and the second switch 56, is connected to the APC circuit in parallel, so that the distortion of the optical output waveform is prevented. Therefore, no bulky circuit is needed in order to change the bias current in accordance with the temperature.

Note that, in the first embodiment, although each of the first and second voltage-current conversion amplifiers 22 and 54 is a current sink type by which the drive current $I_{LD}$ is controlled in the cathode of the semiconductor laser 30, each of the first and second voltage-current conversion amplifiers 22 and 54 can be a current source type by which the drive current $I_{LD}$ is controlled in the anode of the semiconductor laser 30. In such a construction, an operation is the same as that of the first embodiment.

Figure 4:
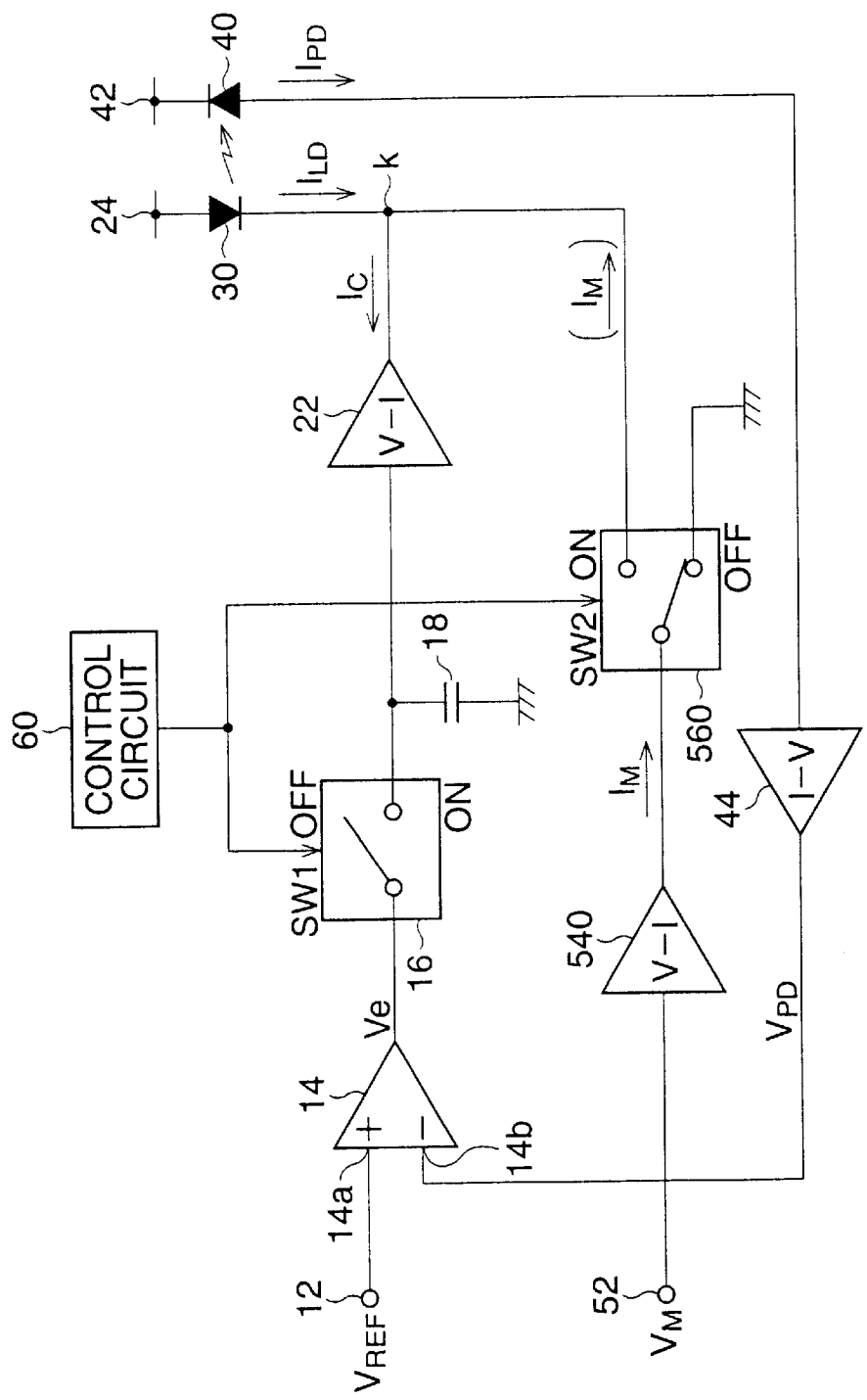
FIG. 4 is a block diagram showing a second embodiment of the semiconductor laser drive device of the present invention.
Figure 5:
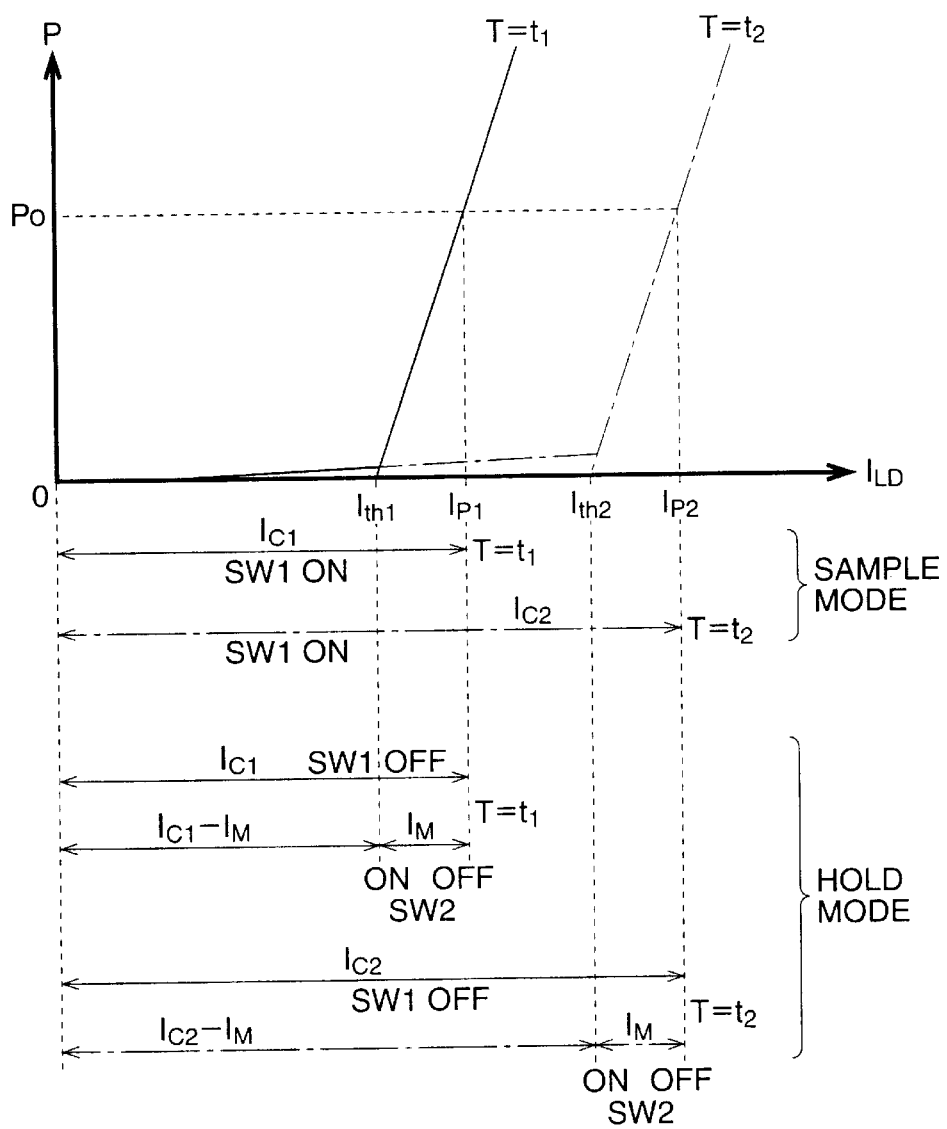
FIG. 5 is a graph indicating a drive current/optical output characteristics of the semiconductor laser of the second embodiment.
Figure 6:
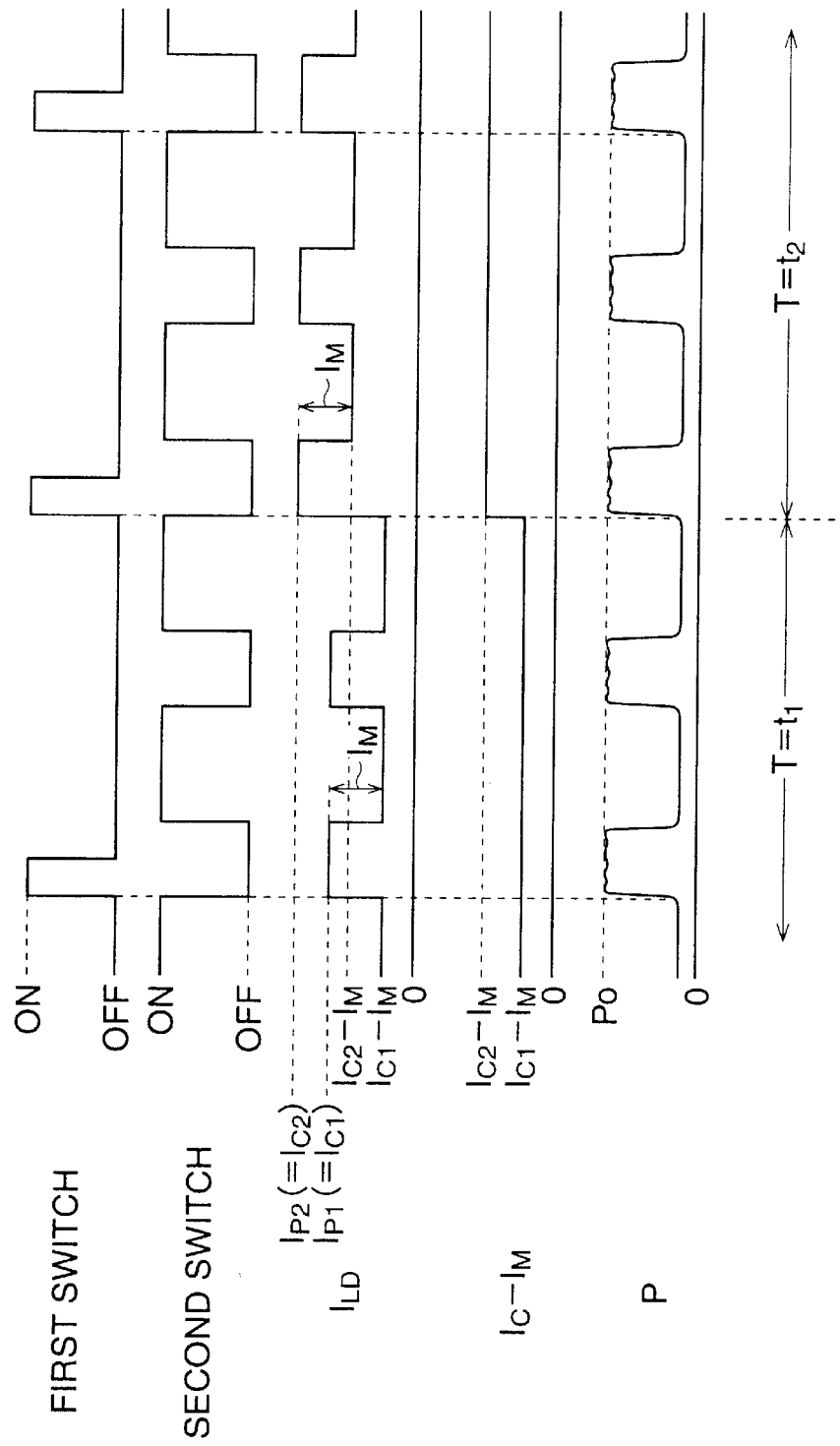
FIG. 6 is a view showing signal waveforms of a first switch of a sample hold circuit, and a second switch, a drive current, and a semiconductor laser of the second embodiment.

FIG. 4 is a block diagram showing a second embodiment of the semiconductor laser drive device of the present invention, and FIG. 5 shows a graph indicating a drive current/optical output characteristics of the semiconductor laser 30 of the second embodiment. FIG. 6 shows signal waveforms of the first switch 16, the second switch 56, the necessary drive current Ip, the bias current $(Ic-I_M)$ and the optical output P of the semiconductor laser 30.

In the second embodiment, constructions of a second voltage-current conversion amplifier 540 and a second switch 560 are different from those of the corresponding components 54 and 56 of the first embodiment. The other constructions are the same as those of the first embodiment, and explanations thereof are omitted. The second voltage-current conversion amplifier 540 is a current sink type by which the drive current $I_{LD}$ is controlled in the anode of the semiconductor laser 30, and the second switch 560 is turned OFF in the sampling mode.

When the first switch 16 is turned ON so that the sample hold circuit 20 is set to the sampling mode, the second switch 560 is turned OFF in synchronization with a timing at which the first switch 16 is turned ON. In the sampling mode, the second switch 560 is always kept turned OFF.

It is supposed that the value of the drive current $I_{LD}$, which is necessary for the semiconductor laser 30 to show a predetermined optical output level Po, is Ip. Under this condition, a current Ic, flowing between the connecting point k and the first voltage-current conversion amplifier 22, coincides with the necessary drive current Ip. In the sample hold circuit 20, the current Ic, i.e., the necessary drive current Ip is sampled. In other words, in the sampling mode, the necessary drive current Ip, which is $Ip_1$ at the temperature $t_1$ and is $IP_2$ at the temperature $t_2$, is sampled by the APC circuit, so that the necessary drive current Ip is controlled to show a proper value.

When the first switch 16 is turned OFF so that the sample hold circuit 20 is set to the holding mode, an electric charge corresponding to the current Ic, which flowed immediately before the switching to the holding mode, is held in the capacitor 18, and is kept flowing in the semiconductor laser 30.

At this time, when the second switch 560 is turned OFF, the current Ic, corresponding to an electric charge accumulated in the capacitor 18, flows in the semiconductor laser 30 as the necessary drive current Ip. Conversely, when the second switch 560 is turned ON, the constant current $I_M$ flows between the connecting point k and the second switch 560, and a current, which is obtained by subtracting the constant current $I_M$ from the current Ic(=Ip) flows in the semiconductor laser 30. The difference between the current Ic(=Ip) and the constant current $I_M$ works as the bias current corresponding to the temperature.

Namely, when the second switch 560 is turned ON and OFF in accordance with a H/L of a pulse signal output by the control circuit 60, the current Ic(=Ip) or the bias current $(Ic-I_M)$ flows in the semiconductor laser 30 in accordance with the H/L of the pulse signal, so that the semiconductor laser 30 is turned ON and OFF. The constant current $I_M$ is set to a value such that the bias current $(Ic-I_M)$ is approximately equal to the threshold value $I_{th}$. Therefore, the bias current $(Ic-I_M)$ is always changed in accordance with the temperature, and thus is set to a value close to the threshold value $I_{th}$.

When the sample hold circuit 20 is set to the holding mode, a current flowing in the semiconductor laser 30 is switched between the bias current $(Ic-I_M)$ (i.e., $Ic_1-I_M$ or $Ic_2-I_M$), which was set immediately before the holding mode was set, and the current Ic (i.e., $Ic_1$ or $Ic_2$) due to the turning ON and OFF of the second switch 560, so that the semiconductor laser 30 is turned ON and OFF in synchronization with the change of the current of the semiconductor laser 30.

Thus, in the second embodiment, the bias current is always changed in accordance with the temperature, and is set close to the threshold value $I_{th}$, similarly to the first embodiment. Accordingly, even at a high temperature ($t_2$), a time, which is needed for reaching a predetermined optical output Po, is approximately the same as that at a low temperature ($t_1$), and thus, a time-lag of the optical output is drastically shortened in comparison with a conventional device, so that the relaxation oscillation is reduced. Therefore, even in a high speed pulse drive, an optical output waveform, which exactly corresponds to a pulse shape of the image signal, is obtained. Further, also in the second embodiment, a simple circuit, which is composed of the second voltage-current conversion amplifier 540 and the second switch 560, is connected to the APC circuit in parallel, so that the distortion of the optical output waveform is prevented.

Note that, in the second embodiment, the first voltage-current conversion amplifier 22 is a current sink type by which the drive current $I_{LD}$ is controlled in the cathode of the semiconductor laser 30, and the second voltage-current conversion amplifier 540 is a current source type by which the drive current $I_{LD}$ is controlled in the anode of the semiconductor laser 30. However, the first voltage-current conversion amplifier 22 may be the current source type and the second voltage-current conversion amplifier 540 may be the current sink type. Due to this construction, the semiconductor laser drive device works in a similar way as the second embodiment.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Application No. 11-223803 (filed on Aug. 6, 1999) which is expressly incorporated herein, by reference, in its entirety.

What is claimed is:

1. A semiconductor laser drive device, comprising:
    a semiconductor laser that emits light;
    a detector that detects an amount of said light emitted by said semiconductor laser;
    a sample hold device, comprising:
        a comparator that compares a light radiation level command signal with a voltage signal related to an output current of said detector;
        a first switching device that selectively switches between a sampling mode, that samples a control current, and a holding mode, that holds said control current; and
        a capacitive device that stores an electrical charge; and
    a second switching device that selectively turns ON and OFF a current supplied to said semiconductor laser when said first switching device is switched to said holding mode, such that said current remains constant regardless of a change in temperature of said semiconductor laser due to said control current, representing a voltage output by said comparator, held by said capacitive device, wherein said first switching device and said second switching device are simultaneously switched when said first switching device and said second switching device are switched to said sampling mode.

2. The semiconductor laser drive device of claim 1, wherein said second switching device selectively turns ON and OFF said current supplied to said laser in response to an image being printed.

3. The semiconductor laser drive device of claim 1, further comprising a voltage-current conversion amplifier that converts said voltage output from said comparator to said control current.

4. The semiconductor laser drive device of claim 1, further comprising a current-voltage conversion amplifier that converts said output current to said voltage signal.

5. A semiconductor laser drive device, comprising:
    a semiconductor laser that emits light;
    a detector that detects an amount of said light emitted by said semiconductor laser;
    a sample hold device, comprising:
        a comparator that compares a light radiation level command signal with a voltage signal related to an output current of said detector;
        a first switching device that selectively switches between a sampling mode, that samples a control current, and a holding mode, that holds said control current; and
        a capacitive device that stores an electrical charge; and
    a second switching device that selectively switches ON and OFF a current supplied to said semiconductor laser in response to an image to be printed when said first switching device is switched to said holding mode, so that said current supplied to said semiconductor laser changes between a bias current and a drive current in synchronization with said ON and OFF switching of said second switching device.

6. The semiconductor laser drive device of claim 5, further comprising a voltage-current conversion amplifier that converts said voltage output from said comparator to said control current.

7. The semiconductor laser drive device of claim 5, further comprising a current-voltage conversion amplifier that converts said output current to said voltage signal.

8. A semiconductor laser drive device, comprising:
    a stabilizing device that controls a drive current to adjust an output power of a semiconductor laser to a predetermined level;
    a sample hold device that at least one of samples a control current and holds said control current;
    a generation device that generates a constant current; and
    a switching device that is held to one of an ON state and an OFF state when said sample hold device samples said control current, said switching device non-periodically switching ON and OFF a supply of said constant current to said semiconductor laser when said sample hold device holds said control current, a current in said semiconductor laser alternating between a bias current and a drive current in synchronization with said ON and OFF switching of said switching device.

9. The semiconductor laser drive device of claim 8, wherein said generation device generates said constant current regardless of a change in temperature of said semiconductor laser.

10. The semiconductor laser drive device of claim 8, wherein said sample hold device includes a capacitive device that stores said bias current when said sample hold device holds said control current, so that said generation device generates said constant current regardless of a change in temperature of said semiconductor laser.

* * * * *